FREQUENCY MODULATED TRANSMITTER WITH CROSSTALK ISOLATION

Filed May 25, 1967 2 Sheets-Sheet 1

INVENTOR.
Hardin G. Stratman
BY Hill, Sherman, Meroni, Gross & Simpson
ATTORNEYS Dec. 1, 1970 H. G. STRATMAN 3,544,919

FREQUENCY MODULATED TRANSMITTER WITH CROSSTALK ISOLATION

Filed May 25, 1967 2 Sheets-Sheet 2

INVENTOR.

Hardin G. Stratman

BY Hill, Sherman, Meroni, Gross & Simpson

ATTORNEYS

United States Patent Office 3,544,919
Patented Dec. 1, 1970

3,544,919
FREQUENCY MODULATED TRANSMITTER WITH CROSSTALK ISOLATION

Hardin G. Stratman, Quincy, Ill., assignor to Gates Radio Company, Quincy, Ill., a corporation of Illinois Filed May 25, 1967, Ser. No. 641,182
Int. Cl. H04j 9/00; H03c 3/08, 3/20
U.S. Cl. 332—16 13 Claims

ABSTRACT OF THE DISCLOSURE

A modulated oscillator for a solid state FM exciter having first and second transistors connected in a push-pull manner and having a main channel audio amplitude varying signal coupled to the input of said transistors. Said transistors together with an inductance in the output circuit thereof forming a tank circuit and generating an output frequency dependent on the amplitude of the input audio signal. A pair of voltage variable capacitors are also connected across the outputs of the push-pull transistors, and a subcarrier channel amplitude varying signal is applied to the voltage variable capacitors to modulate the output frequency of the oscillator without interfering with the modulation developed by the main channel audio input. In addition, an automatic frequency correction signal is applied to a circuit point intermediate the voltage variable capacitors, such that the correction signal is also isolated from both the main channel and subcarrier channel audio inputs. Hence, modulation of the center frequency of the oscillator is achieved at three different circuit input points, while eliminating substantially all crosstalk between the various modulation signals. The entire oscillator circuit is substantially electrically isolated and disposed in an oven and maintained at a substantially constant environmental temperature.

BACKGROUND OF THE INVENTION

Field of the invention

The field of art to which this invention pertains is a solid state FM exciter and, in particular, a modulated oscillator having a unique and simplified means for frequency modulating a series of amplitude varying information signals in a single circuit while eliminating cross talk between the respective modulating signals.

SUMMARY

An important feature of the present invention is the provision of a modulated oscillator for an FM exciter wherein a number of information signals may be simultaneously modulated in a single circuit while substantially eliminating all cross talk between the various information signals.

Another feature of the present invention is the provision of a solid state modulated oscillator for an FM exciter utilizing voltage variable capacitive elements to directly frequency modulate a number of distinct audio information signals.

It is a principal object of this invention to provide a solid state modulated oscillator having an improved efficiency, a greatly reduced cost, and a minimum number of components for frequency modulating a plurality of audio information signals.

It is also an object of this invention to provide a solid state modulated oscillator for an FM exciter which includes a pair of transistors coupled in an oscillator circuit in a push-pull manner and having a voltage variable capacitor connected across the outputs of the transistors to form a second modulation element in addition to the modulation element provided by the transistors themselves.

It is a further object of this invention to provide a solid state modulated oscillator having a pair of transistors connected in a push-pull manner in the oscillator circuit and having a main channel audio input coupled to the input of the respective transistors, wherein the transistors together with an inductance coupled across the output thereof form a tank circuit to modulate the main channel audio input signal and wherein a voltage variable capacitance means is coupled across the output of the transistors to combine with the other reactive elements of the tank circuit to frequency modulate a subcarrier channel audio signal which is coupled to the voltage variable capacitive elements at the output of the transistors.

It is an additional object of this invention to provide a modulated oscillator as described above wherein an automatic frequency correction signal is coupled to the tank circuit output of the modulated oscillator at a point intermediate serially connected polarity opposing voltage variable capacitive elements and wherein the voltage variable capacitive elements isolate the automatic frequency correction signal from the subcarrier channel audio input which is applied to the opposite terminals of the voltage variable capacitors.

It is also an object of this invention to provide a solid state modulated oscillator wherein the center frequency at the oscillator output is substantially constant.

It is another object of this invention to provide a solid state modulated oscillator for an FM exciter wherein all the elements of the oscillator as described above are disposed in a temperature controlled environmental oven, wherein a highly stable output center frequency is obtained regardless of environmental changes ambient the FM exciter.

These and other objects, features and advantages of the present invention will be understood in greater detail in connection with the attached drawings and the following description wherein reference numerals are utilized to designate an illustrative embodiment.

DESCRIPTION OF THE PREFERRED EMBODIMENT

Figure 1:
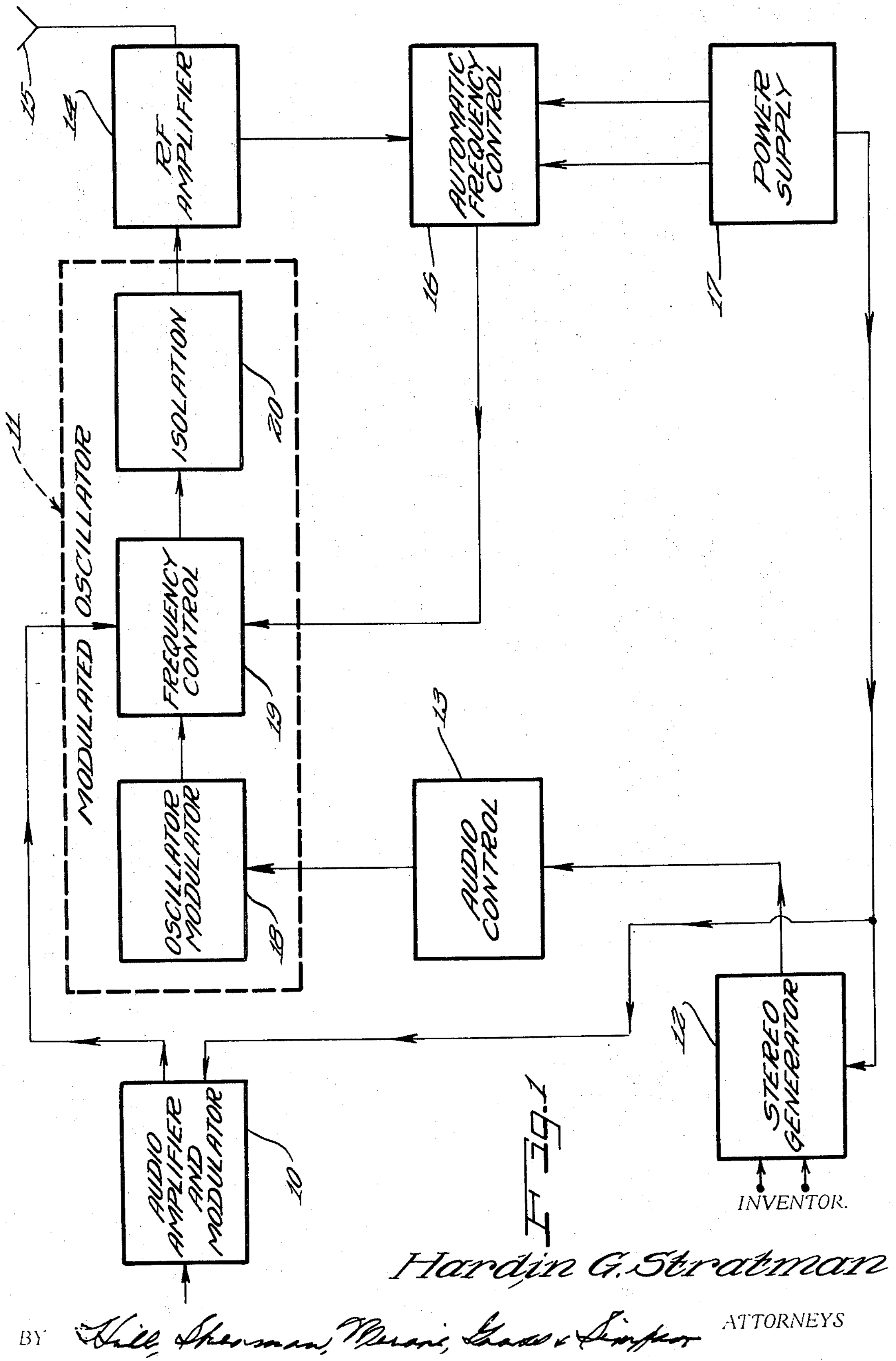
FIG. 1 is a block diagram illustrating the basic functioning of an FM exciter and showing the utility of a modulated oscillator in accordance with the present invention.

Generally, a radio transmitter employing the features of the present invention may include an audio amplifier and modulator 10 which couples subcarrier channel information to the modulated oscillator 11 as shown. A stereo generator 12 couples main audio channel information through an audio control unit 13 to the modulated oscillator 11. The output of the modulated oscillator 11 is an FM signal which contains the frequency modulated information of source 10 and the stereo source 12. This FM signal is coupled to an RF amplifier 14 prior to transmission at an antenna 15.

An automatic frequency control unit 16 senses the frequency at the RF amplifier 14 and applies the necessary correction to the modulated oscillator 11.

A power supply 17 provides the DC power for the entire transmitter as shown by the directional arrows in FIG. 1.

The modulated oscillator 11 may be further described in terms of three separate components, namely an oscillator modulator 18, a frequency control unit 19 and an isolation unit 20. The main channel signal is fed through the audio control 13 to the oscillator modulator 18, and the subcarrier audio signals are fed to the frequency control unit 19. Also, the automatic frequency control or frequency correction signal is coupled from the unit 16 to the frequency control unit 19 along with the subcarrier information signal. The oscillator and frequency control units are isolated by an isolation unit 20 which is coupled intermediate the frequency control unit and the RF amplifier 14.

Figure 2:
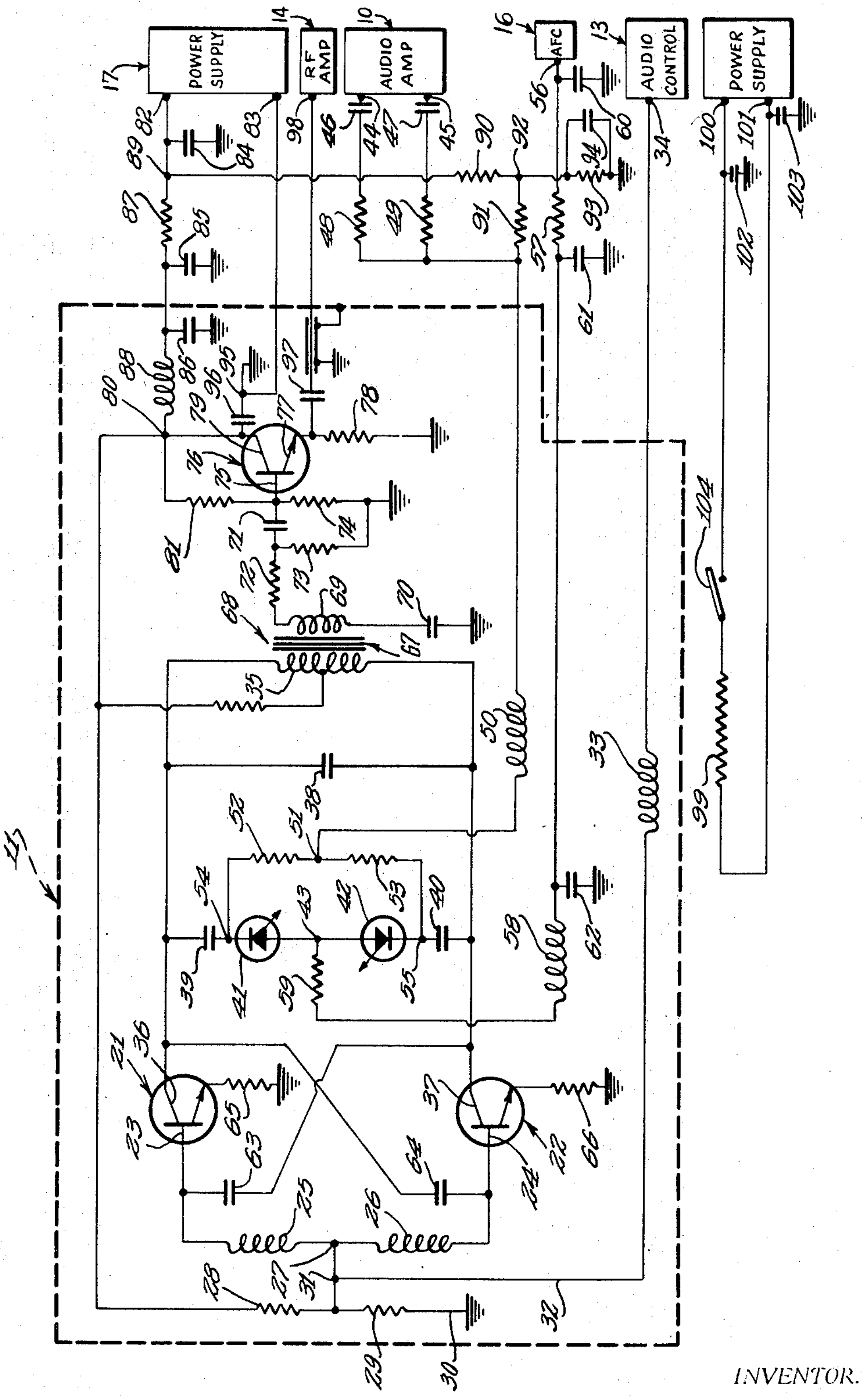
FIG. 2 is a schematic of the modulated oscillator as outlined in FIG. 1 and showing in detail the oscillator circuit means, the several audio input points and the means for isolating the distinct frequency modulated signals from one another.

Referring to the schematic shown in FIG. 2, the oscillator modulator, identified by reference numeral 18 in FIG. 1, includes first and second transistors 21 and 22 which are coupled in push-pull manner as is well understood in the art. In particular, the transistors 21 and 22 have base connections 23 and 24, respectively, which are connected through first and second inductors 25 and 26 to a common input terminal 27. A voltage divider consisting of first and second resistors 28 and 29 grounded at a point 30 establishes a DC level at the input 27 such as one volt DC, for instance.

The main channel audio information signal is coupled to the input point 27 at a junction point 31 through a lead 32. A choke 33 is connected in the line 32 to provide RF isolation. The main channel audio input as applied through the audio control unit 13 of FIG. 1 is coupled to the line 32 at a connector 34.

Referring further to the oscillator which includes the transistors 21 and 22, a coil or inductor 35 is coupled directly across collector terminals 36 and 37 of the transistors 21 and 22, respectively. Accordingly, variations in the collector-to-base capacitance of each of the transistors, together with the inducttance of the coil 35, will establish oscillations in the circuit dependent upon the magnitude of the voltage amplitude varying signal applied to the base terminals 23 and 24. Accordingly, the main channel information as applied to the junction point 31 will be frequency modulated due to variations in the collector-to-base capacitance of the respective transistors.

The oscillator circuit includes further reactive elements. In particular, a capacitor 38 is coupled across the coil 35, forming the main tank circuit thereby. Also, a further branch is connected in parallel with the capacitor 38 and inductor 35. This branch includes capacitors 39 and 40 and voltage variable capacitor diodes 41 and 42. The diodes 41 and 42 are serially connected and polarity opposing such that anodes of both diodes are connected together at a common circuit junction point 43. First and second subcarrier channel audio information may be supplied via first and second connectors 44 and 45 to the voltage variable capacitor diodes 41 and 42. The subcarrier channel information is applied through respective capacitors 46 and 47 and bias setting resistors 48 and 49 and through an isolation choke 50 to a circuit junction point 51. The subcarrier information is then coupled directly through resistors 52 and 53 to circuit junction points 54 and 55 corresponding to the cathodes of the respective voltage variable capacitors 41 and 42.

In view of the foregoing, therefore, it is apparent that the subcarrier channel information which is applied to the circuit junction points 54 and 55 is substantially isolated from the main channel input points at the base connections 23 and 24 of the respective transistors. The frequency modulation of the subcarrier information is accomplished by variations in the capacitance of the voltage variable capacitors 41 and 42. This isolation of the two information input signals substantially eliminates cross talk between such signals which has heretofore been a major obstacle to the development of the present circuit.

An automatic frequency correction signal is applied through a connector 56, a resistor 57, an isolation choke 58 and a further resistor 59 to the circuit junction point 43 intermediate the voltage variable capacitors 41 and 42.

Capacitors 60, 61 and 62 are also provided to assure RF isolation from the frequency correction input.

As shown in FIG. 1, the frequency of the RF amplifier 14 is sensed at the automatic frequency control unit 16, and a variable voltage is provided to the circuit junction point 43 in FIG. 2 in accordance with the drifting of the center frequency of the RF amplifier. For instance, if the modulated oscillator attempts to rise in frequency, a positive voltage from the automatic frequency control 16 will be applied to the anodes of diodes 41 and 42 through the resistor 59. This tends to counteract the fixed bias applied through resistors 52 and 53 and reduces the overall reverse bias. This causes the effective capacity of diodes 41 and 42 to increase and reduces the output frequency of the modulated oscillator circuit.

Conversely, if the frequency of the oscillator attempts to lower, a negative bias will be provided to the anodes of the diodes 41 and 42 in such a manner that their effective capacity is reduced. This, in turn, increases the output frequency of the modulated oscillator. It is apparent, therefore, that not only is the subcarrier information isolated from the main channel information, but also the automatic frequency control information is isolated by means of the diodes 41 and 42 from the sub-carrier and main channel information. Accordingly, the oscillator of this invention has three inputs which may be used to shift the output frequency of the system and which substantially eliminate all cross talk between the various input information signals.

The feedback for the oscillator is provided by a pair of capacitors 63 and 64 which are connected from the output of the oscillator to the base terminals 23 and 24 of the respective transistors 21 and 22. This provides positive feedback, in phase, to the transistors and allows the oscillations to be regenerative.

To assure that the RF output is relatively constant regardless of whether the tank circuit is tuned to one of a variety of output frequencies, degeneration is introduced by means of unbypassed emitter resistors 65 and 66. If capacitors were connected across resistors 65 and 66, the overall gain would be increased, but a gain variation would be experienced as the oscillator circuit was tuned from one end of the available band to the other. By introducing degeneration into this circuit, amplitude variations of the oscillator are substantially eliminated.

The oscillator is tuned by means of a variably positioned slug 67 which is disposed as is well understood in a transformer 68 having a primary winding 35 and a secondary winding 69. The transformer and oscillator are arranged such that the circuit may be tuned between 88 and 108 megacycles, for instance.

Capacitors 70 and 71 are connected to the secondary winding 69 of the transformer 68. The capacitor 60 provides an RF ground for the transformer 68, and the capacitor 71 isolates the DC associated with the oscillator from the RF amplifier. Resistors 72, 73 and 74 provide a voltage divider circuit to establish the required input level to the base 75 of a transistor 76. The transistor 76 is connected as an emitter follower and gives approximately 20 db of isolation to the oscillator, The emitter 77 of the transistor 76 is connected through a resistor 78 to ground, and the collector 79 is connected to a DC supply and a circuit junction point 80. A resistor 81 supplies a bias level to the base terminal 75 of the transistor 76.

The power supply 17 as shown in FIG. 1 is coupled to the entire network through connectors 82 and 83, and a filter provided by a series of capacitors 84, 85 and 86 together with a resistor 87 and an isolation choke 88 eliminates any ripples in the power supply signal. The DC level for the voltage variable diodes 41 and 42 is established by a connection from the DC power supply line at a point 89 through a resistor 90, a further resistor 91 and the inductor 50 to the circuit junction point 51. A circuit junction point 92 is connected to ground through an RC circuit consisting of a resistor 93 and a parallel capacitor 94. The negative terminal of the power supply as shown at 83 is grounded at a circuit junction point 95, and a capacitor 96 is connected between ground 95 and the collector 79 of the transistor 76.

The RF output from the transistor 76 is coupled from the emitter 77 through a capacitor 97 to a connector 98. The RF output is supplied to an RF amplifier 14 as shown in FIG. 1 prior to being broadcasted at an antenna 15.

Stability of the entire oscillator as identified by the reference numeral 11 in FIG. 2 and in FIG. 1 is disposed in an oven to maintain a substantially stable environmental temperature for the reactive components of the oscillator which determine the modulation output. The shield and oven are shown symbolically in FIG. 2 in terms of a resistor 99 which may be coupled to the DC power supply at a pair of connectors 100 and 101. A pair of RF grounds in the form of capacitors 102 and 103 are provided in the heater control circuit. A thermostat operated circuit breaker is indicated generally by a simple throw switch 104. It is understood that the switch 104 will operate in accordance with the control of a temperature sensitive unit to maintain the environmental temperature stability of the oven and shield.

I claim:

1. In an FM exciter, a modulated oscillator comprising:
- oscillator circuit means for developing a voltage frequency variable output in response to a voltage amplitude variable input,
- said oscillator circuit means having first and second inputs,
- means for applying a first voltage amplitude variable modulation signal to said first input of said oscillator circuit means,
- means for applying a second voltage amplitude variable modulation signal to said second input of said oscillator circuit means,
- first and second solid state modulating devices and means for coupling said first and second inputs to said devices respectively,
- means for substantially isolating said first input from said second input, and
- means for stabilizing the center range output frequency of said oscillator circuit means,
- whereby said oscillator circuit means is responsive to said first and second modulation signals independently while substantially eliminating cross talk between said signals.

2. A modulated oscillator in accordance with claim 1 wherein said oscillator circuit means has a third input, wherein a frequency drift correction voltage amplitude varying signal is applied to said third input and wherein said third input is substantially isolated from both said first and second inputs, whereby amplitude variations in said frequency drift correction voltage do not affect the modulation of said oscillator circuit means by either of said first and second modulation signals.

3. A modulated oscillator in accordance with claim 1 wherein said oscillator circuit means comprises at least one amplifier means, said first input of said oscillator circuit means also being the input of said one amplifier means, a frequency determining energy storage element connected to the output of said one amplifier means and forming a closed circuit loop with said first input, and wherein said second input is provided at the output side of said one amplifier means.

4. A modulated oscillator in accordance with claim 3 wherein a pair of voltage variable capacitor diodes are oppositely serially connected at the output of said one amplifier means and are coupled through said closed loop to the input of said one amplifier means and wherein said third input means is provided at the junction of said voltage variable capacitor diodes, whereby said third input means provides a circuit point for modulating the output frequency of said oscillator circuit means without interfering with the modulation thereof by said first and second modulation signals.

5. A modulated oscillator in accordance with claim 4 wherein each of said diodes have first and second terminals, said first terminals of said diodes being coupled together at a common junction point corresponding to said third input and wherein said second modulation signal is coupled to each of said second terminals thereof, whereby said third input and said second modulation signals are isolated by said diodes.

6. A modulated oscillator comprising:
- first and second transistors coupled together and forming a push-pull amplifier circuit,
- a frequency determinative network coupled across the outputs of said first and second transistors,
- feedback means coupling the output frequency of said frequency determinative network to the input of each of said first and second transistors, thereby establishing regenerative circuit oscillations at a frequency established by the parameters of said frequency determinative network,
- means for applying an amplitude varying voltage information signal to the inputs of each of said first and second transistors to develop variations in the output frequency of said frequency determinative network in accordance with the amplitude variations in said information signal.
- said frequency determinative network including a voltage variable capacitor branch, and
- means for applying a second voltage amplitude varying information signal across said voltage varying capacitor branch thereby causing variations in the output frequency of said frequency determinative network which are independent of the variation in frequency developed thereby by said first information signal applied to the inputs of said first and second transistors.

7. A modulated oscillator in accordance with claim 6 wherein said capacitor branch includes first and second voltage variable capacitor diodes connected serially and polarity opposing across the outputs of each of said first and second transistors, wherein said second information signal is coupled to like non-adjacent terminals of said first and second diodes, wherein a third information signal is coupled to the common junction point of said first and second diodes, the frequency output of said frequency determinative network being varied in accordance with each of said first, second and third information signals whereby cross talk between said signals is substantially eliminated.

8. A modulated oscillator in accordance with claim 6 wherein all of said circuit elements are disposed in an oven and wherein means are provided to assure that the environmental temperature within said oven is maintained substantially uniform.

9. A modulated oscillator in accordance with claim 7 wherein means are provided to maintain said diodes continually in a reversed biased state during the operation of said first and second push-pull coupled transistors.

10. A modulated oscillator in accordance with claim 9 wherein said first and second diodes are connected to have common anodes and wherein a reversed biasing signal is applied together with said second modulation signal to the cathodes of each of said first and second diodes.

11. In an RF transmitter including a main audio channel and at least one subcarrier channel, a modulated oscillator comprising:
- first and second transistors coupled together and forming a push-pull amplifier circuit,
- said main audio channel being coupled to the inputs of said first and second transistors,
- inductance means coupled across the outputs of said first and second transistors and forming a tank circuit together with the input-to-output capacity of said respective transistors, a pair of voltage variable capacitor diodes connected serially and polarity opposing across the outputs of said first and second transistors, said subcarrier channel being coupled to the non-adjacent terminals of said diodes, and means maintaining said diodes reversed biased, whereby cross talk between said main and subcarrier channels is substantially eliminated.

12. A modulated oscillator in accordance with claim 11 wherein an automatic frequency control voltage is applied to the junction of said diodes to adjust the center frequency of said tank circuit in response to drifting thereof.

13. A modulated oscillator in accordance with claim 12 wherein oven means are provided to stabilize the environmental conditions ambient to said circuit elements during the operation therfeof.

References Cited

UNITED STATES PATENTS

| | | | |
|---|---|---|---|
| 3,005,167 | 10/1961 | Bott et al. | 332—21 |
| 3,020,493 | 2/1962 | Carroll | 332—30VX |
| 3,050,693 | 8/1962 | Sinninger | 331—10 |
| 3,208,007 | 9/1965 | Schodowski | 331—176X |
| 3,388,344 | 6/1968 | West | 331—176X |

ALFRED L. BRODY, Primary Examiner

U.S. Cl. X.R.

179—15; 325—148; 331—36; 332—19, 30